(12) United States Patent
Prodanov (10) Patent No.: US 7,084,705 B2
(45) Date of Patent: Aug. 1, 2006

(54) AUTOMATIC BIASING OF A POWER DEVICE FOR LINEAR OPERATION

(75) Inventor: Vladimir Prodanov, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 79 days.

(21) Appl. No.: 10/856,993

(22) Filed: Jun. 1, 2004

(65) Prior Publication Data

US 2005/0264361 A1    Dec. 1, 2005

(51) Int. Cl.
*H03G 3/10* (2006.01)
(52) U.S. Cl. ..................................... 330/285
(58) Field of Classification Search ................. 330/285
See application file for complete search history.

(56) References Cited

U.S. PATENT DOCUMENTS

| | | | | |
|---|---|---|---|---|
| 5,999,051 A * | 12/1999 | Terada et al. | ................ | 330/254 |
| 6,265,943 B1 * | 7/2001 | Dening et al. | ............... | 330/296 |
| 6,429,746 B1 * | 8/2002 | Koukkari | .................... | 330/296 |
| 6,496,067 B1 * | 12/2002 | Behzad et al. | ............... | 330/261 |
| 6,650,181 B1 * | 11/2003 | Shinjo et al. | ................ | 330/136 |
| 6,803,822 B1 * | 10/2004 | Kim et al. | ................... | 330/296 |
| 6,937,102 B1 * | 8/2005 | Lopez et al. | ................ | 330/296 |
| 2005/0077963 A1 * | 4/2005 | Behzad | ........................ | 330/285 |

* cited by examiner

*Primary Examiner*—Robert Pascal
*Assistant Examiner*—Krista M. Flanagan (57) ABSTRACT

A power device(s) is biased and operates in Class-AB. Crossover distortion is minimized over a broad range of operating conditions, not only for a nominal case. The bias current of a power transistor is automatically adjusted in response to process and temperature variations. Preferably, the adjustment is performed using an error-feedback arrangement. An exemplary 'rule' for bias adjustment involves satisfying a proportionality relationship between the small-signal device transconductance at the operating point, and a maximum device transconductance. A dual replica master-slave control architecture is utilized. A self-adapting circuit is provided to change the bias current (or voltage) so that the value is always the optimum value, irrespective of operating temperature and/or process variations. Self-biasing is introduced wherein no manual adjustment is necessary. A stable amplifier is formed having great robustness to process and temperature variations.

21 Claims, 12 Drawing Sheets

AUTOMATIC BIASING OF A POWER DEVICE FOR LINEAR OPERATION

BACKGROUND OF THE INVENTION

1. Field of the Invention

This invention relates to power devices, modules and amplifiers. More particularly, it relates to biasing of a power transistor.

2. Background of Related Art

As is known, a very specific bias is required to ensure the linearity of Class-AB power amplifiers. However, the value of the required 'optimum' bias current varies somewhat with process and temperature.

To accommodate this variation, conventional devices provide a fixed bias (usually current) such that under nominal conditions, the best linearity is achieved. Ideally such conventional device would be maintained in an environmental condition to maintain it as close as possible to the nominal conditions (e.g., at a given temperature). However, as is appreciated by the present inventors, we do not live in an ideal world. As such, conventional devices nevertheless have some amount of degradation due to process and/or temperature variations.

Such fixed Class-AB bias typically results in sub-optimum linearity for any condition other than exactly the nominal condition. It is marketable and very desirable to meet or exceed certain given linearity specifications over a broad temperature range. Thus, any sensitivity of the linearity of a power device such as a power transistor to temperature directly translates into a potential reduction in the product yield.

There is a need for a power device having great linearity over a broad range of temperatures, particularly a Class AB type power device.

SUMMARY OF THE INVENTION

In accordance with the principles of the present invention, a system for biasing an electronic circuit containing a non-linear device is provided. An electronic circuit containing a non-linear device produces an output analog signal from an input analog signal. A sensing circuit coupled to the electronic circuit produces a first signal proportional to a first transconductance value of the non-linear device, and a second signal proportional to a second transconductance value of the non-linear device. A comparator circuit coupled to the sensing circuit produces an error signal based on the first signal and the second signal. A control circuit coupled to the comparator circuit adjusts the second transconductance value of the non-linear device using the error signal to provide a feed-back signal to the electronic circuit.

In other aspects of the invention, a method for automatically biasing a power device comprises providing a first replica device that is a scaled-down version of the power device. A proportionality relationship is forced between a transconductance for a bias output to the first replica device and a maximum transconductance of the power device. The bias output to the power device is automatically adjusted based on changes in the bias output to the first replica device.

In accordance with another aspect of the present invention, an automatic adjustable bias generator for a power device comprises a first replica device which is a scaled-down version of the power device. A fixed bias generator biases the first replica device. A second replica device is included which is also a scaled-down version of the power device. An adjustable bias generator biases the second replica device. The adjustable bias generator receives input from the first replica device and the second replica device, and is adapted for biasing the power device.

BRIEF DESCRIPTION OF THE DRAWINGS

Features and advantages of the present invention will become apparent to those skilled in the art from the following description with reference to the drawing, in which.

DETAILED DESCRIPTION OF ILLUSTRATIVE EMBODIMENTS

A method for biasing a circuit is disclosed that results in better circuit performance over temperature and process variations. The biased circuit may be, e.g., an amplifier, such as a Class A-B amplifier.

In disclosed embodiments, an amplifier is biased using transistors with grounded source/emitter. A pair of differential voltages are generated wherein one of the corresponding common-mode voltages is fixed while the other is variable.

Three exemplary embodiments are described: a feedback topology, a first master-slave topology, and a second master-slave topology.

In the feedback topology, the required two gm measurements are performed upon the true, controlled device (e.g., a Class A-B amplifier). In the first master-slave topology, the required two gm measurements are performed upon a replica device. The true, controlled device (e.g., a Class A-B amplifier) is 'slaved' to the replica.

In the second master-slave topology, each of the required two gm measurements are performed upon a different replica device. A feedback loop controls the bias of one of the replica devices. The resultant bias level is applied to the true device.

The constant-gm bias method uses, e.g., M-S 2 topology. The gm measurements are preferably performed using differential DC techniques. One of the gm values used in the ratio is the maximum achievable gm of the true, controlled device (e.g., a transistor). The other gm value used is the gm at the desired operating point, e.g. chosen to be desirably located within a linear operating range of the controlled device with respect to a variation in temperatures.

A pair of differential voltages are generated with one of the common-mode voltages being fixed and the other being variable is needed to perform the required gm measurements using differential DC techniques. The disclosed embodiments are compact, e.g., requiring only 3 transistors and some resistors, and therefore is compatible with any device technology.

Figure 1:
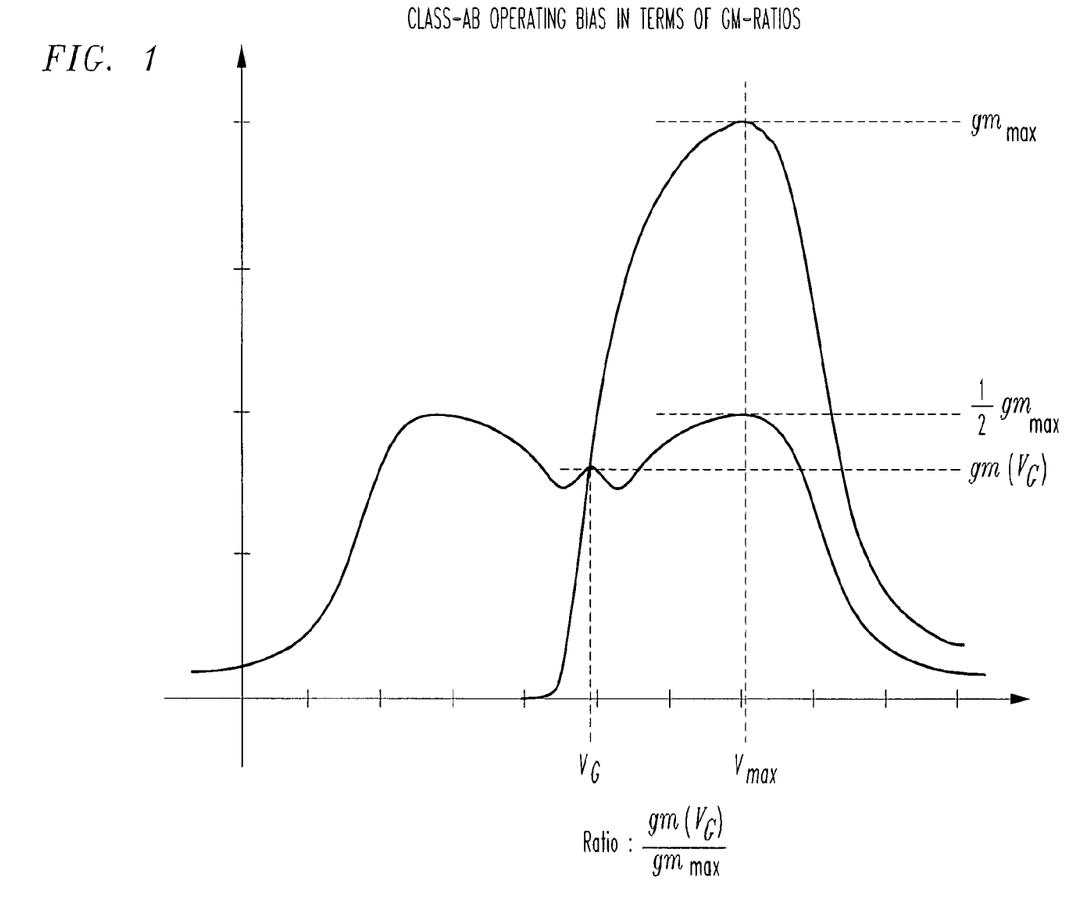
FIG. 1 graphically shows the use of a ratio of a desired operating point gm to $gm_{max}$ to control an operating bias of a Class-AB device in a desirable linear region, in accordance with the principles of the present invention.

FIG. 1 graphically shows the use of a ratio of a desired operating point gm to $gm_{max}$ to control an operating bias of a Class-AB device in a desirable linear region, in accordance with the principles of the present invention.

Importantly, in accordance with the principles of the present invention, a constant gm ratio (not a constant gm) is maintained, as depicted in FIG. 1. Rather than maintaining a fixed gm as is performed by conventional biasing circuits, a ratio of a desired operating point to the maximum gm is maintained. While any ratio greater than 0 and less than one is possible, a preferred or optimum ratio of $gm/gm_{max}$ is determined to fall between 0.3 and 0.5.

Figure 2:
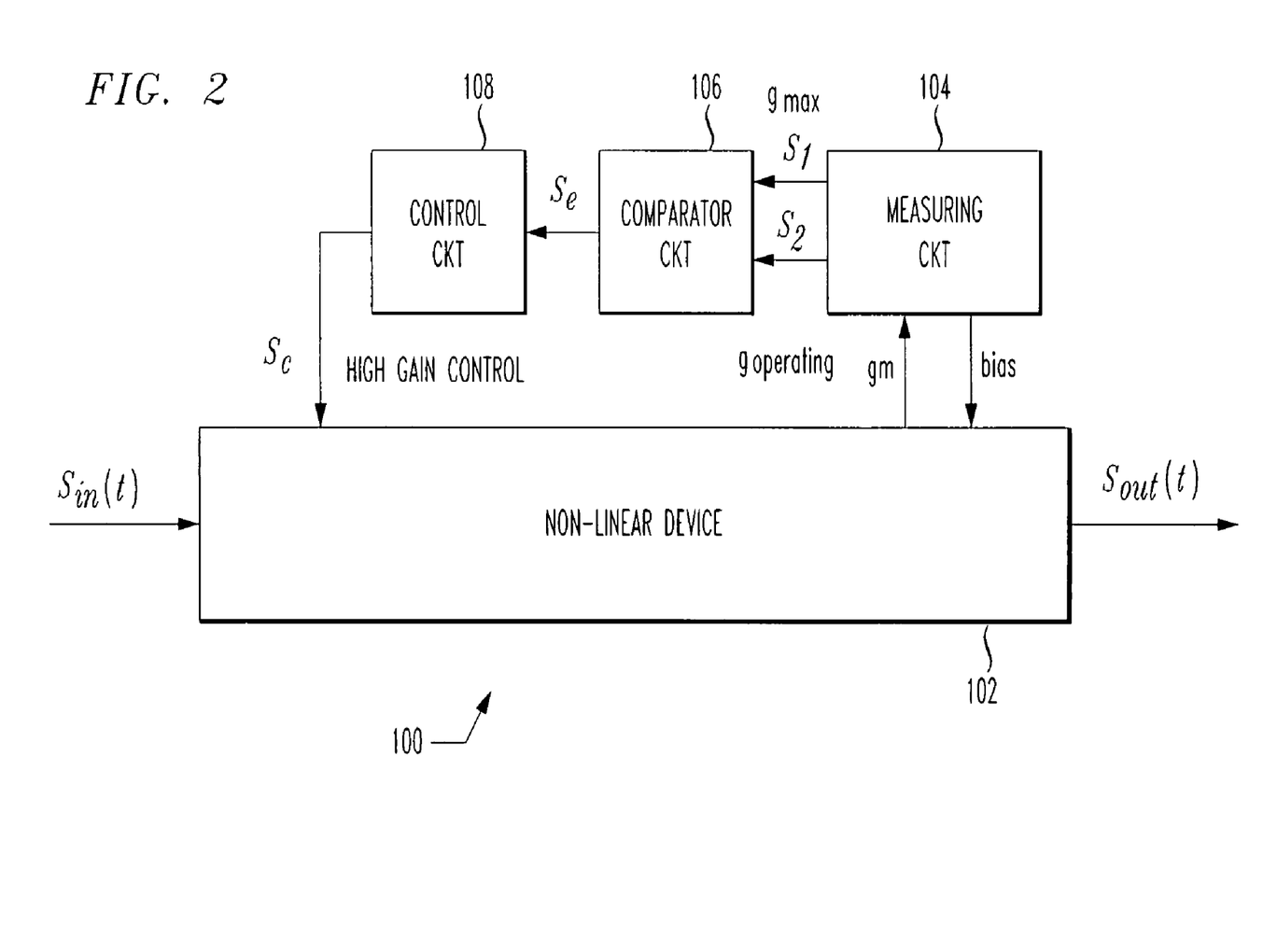
FIG. 2 shows a first embodiment of the present invention wherein a measuring circuit measures the transconductance of the non-linear device at two distinct operating points, in accordance with the principles of the present invention.

FIG. 2 shows a first embodiment of the present invention wherein a measuring circuit measures the transconductance of the non-linear device at two distinct operating points, in accordance with the principles of the present invention. The circuit of FIG. 2 provides true feedback in that the gm that needs to be constrained is measured directly.

As shown in FIG. 2, the operating point of an electronic circuit 102 is controlled through a feedback loop including a measuring circuit 104, a comparator circuit 106, and a control circuit 108.

The electronic circuit 102 is any device that produces an analog output signal from an analog input signal. The electronic circuit 102 contains a non-linear device (e.g., a Class AB amplifier) that can be characterized using a non-constant transconductance (gm) to voltage relationship. The electronic circuit 102 includes a terminal that changes the operating point of the non-linear device and alters device transconductance.

The measuring circuit 104 receives and measures the transconductance of the non-linear device at two distinct operating points. One of the operating points is predetermined (i.e., fixed), while the other is to be established. The fixed operating point is, e.g., the maximum transconductance gmax. The measuring circuit produces a bias signal which is proportional to the device transconductance at one operating point, which it uses to bias the electronic circuit 102. The measuring circuit outputs two values to a comparator circuit 106: a value of gmax and a value of the desired operating point gm.

The measuring circuit 104 of FIG. 2 may measure the gm of the electronic circuit 102 at two points using, e.g., time multiplexing wherein the gm is measured at a first operating point, then at a second operating point.

The comparator circuit 106 produces an output error signal based on a difference between two input signals received from the measuring circuit 104. The output of the comparator circuit 106 is proportional to an amount of error in the operating point of the electronic circuit 102. The output of the comparator circuit 106 is typically a very low voltage level, e.g., on a 1 millivolt level, though it need not be low voltage.

The control circuit 108 is a very high gain block which generates an output high gain control signal (e.g., on the order of 10 volts) which changes the operating point of the non-linear device in the electronic circuit 102.

Equations governing the operation of the system shown in FIG. 2 are as follows. Equations governing the measuring circuit 104 based on measurements of the transconductance of the non-linear device in the electronic circuit 102 evaluated at two different operating points:

$$s_1 = k_1 gm|_{o.p.1}$$

$$s_2 = k_2 gm|_{o.p.2}$$

The comparator circuit 106 accomplishes the following weighted difference of input signals:

$$s_e = \alpha_1 s_1 - \alpha_2 s_2$$

Equations governing the goal of the system 100, including the electronic circuit 102, the measuring circuit 104, the comparator 106, and the control circuit 108, are:

$$\frac{gm|_{o.p.1}}{gm|_{o.p.2}} \approx const.$$

Or, more specifically, the error signal of the feedback loop is forced to become zero, resulting in a constant ratio of transconductances as follows:

$$s_e \approx 0 \Rightarrow \frac{s_2}{s_1} \approx \frac{\alpha_1}{\alpha_2} \Rightarrow \frac{gm|_{o.p.2}}{gm|_{o.p.1}} \approx \frac{\alpha_1}{\alpha_2} \frac{k_1}{k_2}$$

Figure 3:
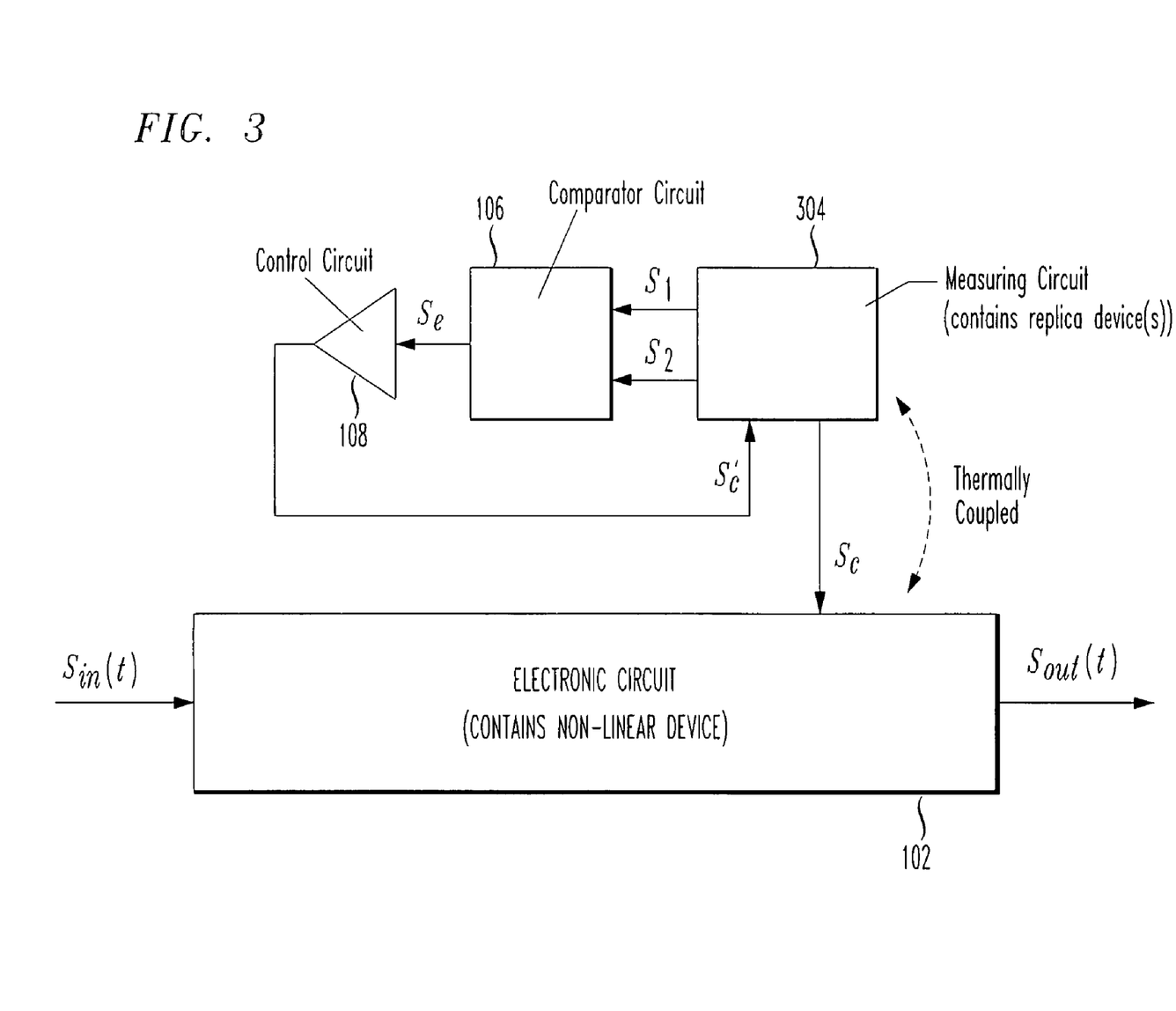
FIG. 3 shows a second embodiment of the present invention wherein a measuring circuit including replica device(s) measures the transconductance of the non-linear device at two distinct operating points, in accordance with the principles of the present invention.

FIG. 3 shows a second embodiment of the present invention wherein a measuring circuit including replica device(s) measures the transconductance of the non-linear device at two distinct operating points, in accordance with the principles of the present invention.

In particular, as shown in FIG. 3, a master-slave topology is formed. Importantly, the feedback loop does not include the electronic circuit whose transconductance gm will be constrained. Rather, the loop is built around a replica device (s) and the desired transconductance (gm) constraint is achieved indirectly by similarity between the replica devices in the measuring circuit 304, and the non-linear device in the electronic circuit 102.

The circuit of FIG. 3 is easier to implement because no measurements are taken directly upon the non-linear device, so the signal processing in the electronic circuit 102 may continue uninterrupted.

Equations governing the operation of the system shown in FIG. 3 are as follows. Equations governing the measuring circuit 304 are based on measurements of the transconductance of the replica device(s) in the measuring circuit 304 evaluated at two different operating points:

$$s_1 = k_1 gm_R|_{o.p.1}$$

$$s_2 = k_2 gm_R|_{o.p.2}$$

The comparator circuit 106 accomplishes the following weighted difference of input signals:

$$s_e = \alpha_1 s_1 - \alpha_2 s_2$$

Equations governing the goal of the system of FIG. 3 are as follows:

$$s_e \approx 0 \Rightarrow \frac{s_2}{s_1} \approx \frac{\alpha_1}{\alpha_2} \Rightarrow \frac{gm_R|_{o.p.2}}{gm_R|_{o.p.1}} \approx \frac{\alpha_1}{\alpha_2}\frac{k_1}{k_2}$$

An equation representing the device-to-replica matching device and equal temperature is as follows:

$$\frac{gm_R|_{o.p.2}}{gm_R|_{o.p.1}} \approx \frac{gm|_{o.p.2}}{gm|_{o.p.1}}$$

And the goal of the overall system of FIG. 3 may be represented as follows:

$$\frac{gm|_{o.p.2}}{gm|_{o.p.1}} \approx \frac{\alpha_1}{\alpha_2}\frac{k_1}{k_2}$$

Figure 4:
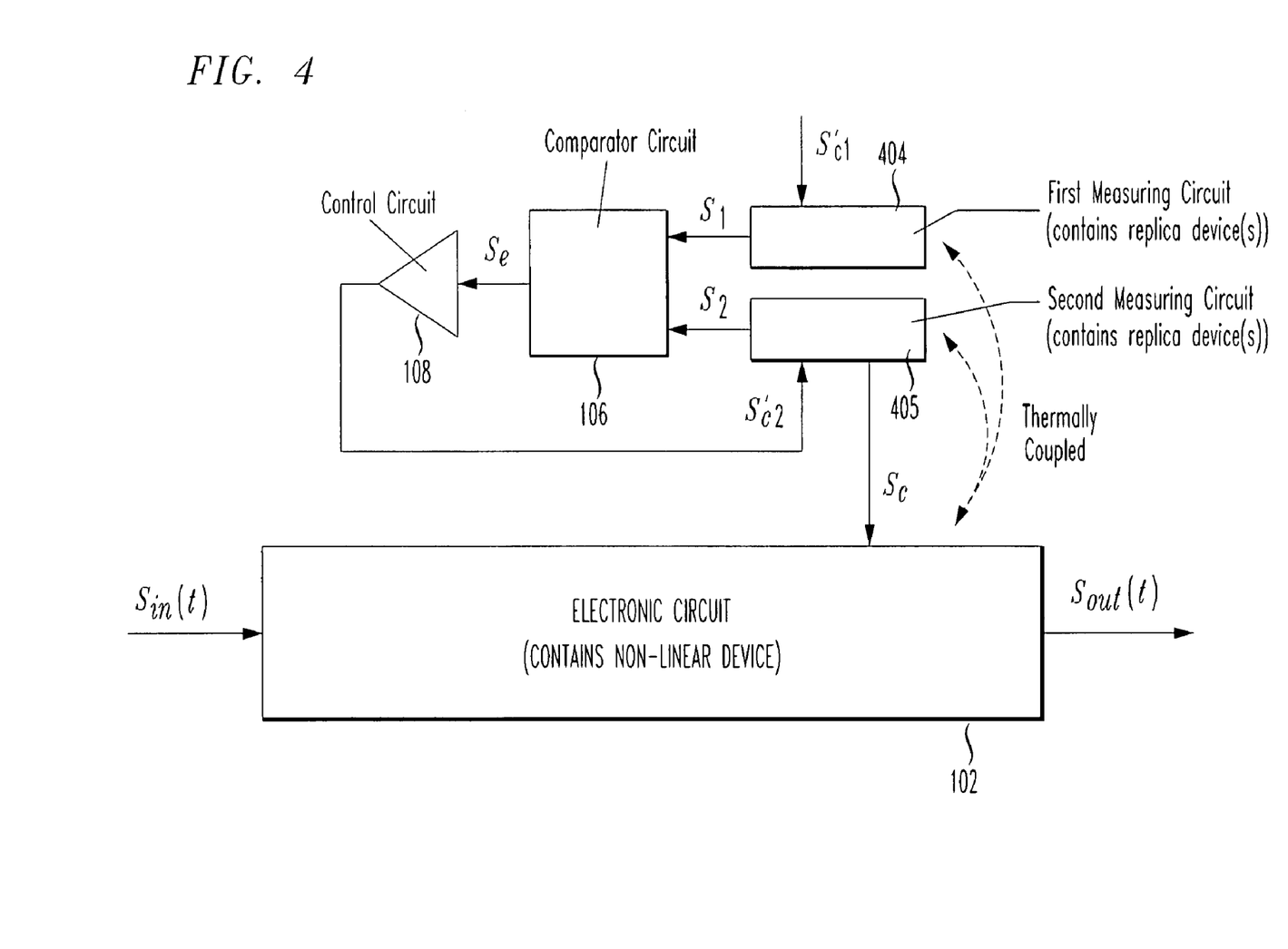
FIG. 4 shows a third embodiment of the present invention wherein two separate measuring circuits each including replica device(s) measure the transconductance of the non-linear device at two distinct operating points, in accordance with the principles of the present invention.

FIG. 4 shows a third embodiment of the present invention wherein two separate measuring circuits each including replica device(s) measure the transconductance of the non-linear device at two distinct operating points, in accordance with the principles of the present invention.

In particular, as shown in FIG. 4, a master-slave topology is implemented similar to that of FIG. 3, but using two separate measuring circuits 404, 405, each containing its own replica device. The circuit of FIG. 4 is easy to implement because no measurements are made upon the non-linear device in the electronic circuit 102. The signals S1, S2 output respectively from the two measuring circuits 404, 405, are derived by measuring two separate replica devices. The system of FIG. 4 assumes similarity between the non-linear device of the electronic circuit 102 and the replica devices used in the first measuring circuit as well as the replicas used in the second measuring circuit.

Note that in the system of FIG. 4, the first and second measuring circuits 404, 405 are thermally coupled with the non-linear device in the electronic circuit 102.

Equations governing the operation of the system shown in FIG. 4 are as follows. The transconductance of the replica device used in the first measuring circuit 404 is evaluated at the first operating point. This operating point (o.p.) is predetermined and fixed.

$$s_1 = k_1 gm_{R1}|_{o.p.1}$$

The transconductance of the replica device used in the second measuring circuit 405 is evaluated at the second operating point. This operating point is controlled by the loop.

$$s_2 = k_2 gm_{R2}|_{o.p.2}$$

The comparator circuit 106 accomplishes the following weighted difference of input signals:

$$s_e = \alpha_1 s_1 - \alpha_2 s_2$$

Equations governing the goal of the system of FIG. 4 are as follows, which shows a constant ratio of transconductances of two separate replica devices evaluated at two different operating points:

$$s_e \approx 0 \Rightarrow \frac{s_2}{s_1} \approx \frac{\alpha_1}{\alpha_2} \Rightarrow \frac{gm_{R2}|_{o.p.2}}{gm_{R1}|_{o.p.1}} \approx \frac{\alpha_1}{\alpha_2}\frac{k_1}{k_2}$$

An equation representing the replica-to-replica matching device and equal temperature is as follows:

$$\frac{gm_{R2}|_{o.p.1}}{gm_{R1}|_{o.p.1}} \approx \frac{gm_{R2}|_{o.p.2}}{gm_{R1}|_{o.p.2}} \approx \frac{Size_{R2}}{Size_{R1}}$$

If the devices are matched, the ratio of their transconductances (evaluated at the same operating point) equals the ratio of their sizes. This holds true for any operating point.

An equation representing the loop and replica-to-replica matching is as follows:

$$\frac{\frac{Size_{R2}}{Size_{R1}} gm_{R1}\big|_{o.p.2}}{gm_{R1}|_{o.p.1}} \approx \frac{\alpha_1}{\alpha_2}\frac{k_1}{k_2} \Rightarrow \frac{gm_{R1}|_{o.p.2}}{gm_{R1}|_{o.p.1}} \approx \frac{Size_{R2}}{Size_{R1}}\frac{\alpha_1}{\alpha_2}\frac{k_1}{k_2}$$

An equation representing replica-to-device matching and equal temperature is as follows:

$$\frac{gm_{R1}|_{o.p.2}}{gm_{R1}|_{o.p.1}} \approx \frac{gm_{R2}|_{o.p.2}}{gm_{R2}|_{o.p.1}} \approx \frac{gm|_{o.p.2}}{gm|_{o.p.1}}$$

The goal of the overall system of FIG. 4 may be represented as follows:

$$\frac{gm|_{o.p.2}}{gm|_{o.p.1}} \approx \frac{Size_{R2}}{Size_{R1}}\frac{\alpha_1}{\alpha_2}\frac{k_1}{k_2}$$

Figure 5:
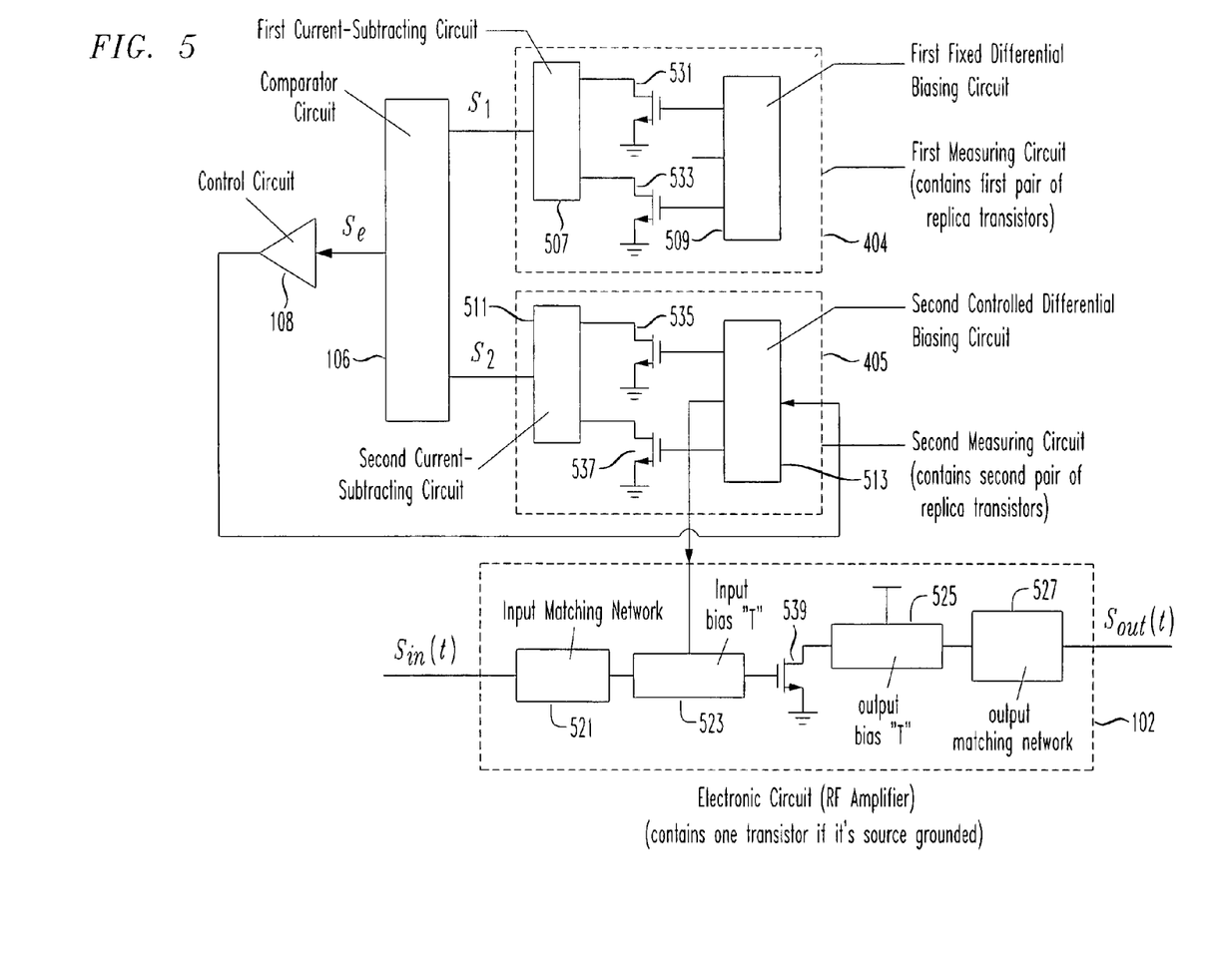
FIG. 5 shows the elements of the third embodiment of FIG. 4 in more detail.

FIG. 5 shows the elements of the third embodiment of FIG. 4 in more detail.

In particular, as shown in FIG. 5, the first measuring circuit 404 contains a first pair of replica transistors 531, 533, a first current subtracting circuit 507, and a first fixed differential biasing circuit 509. The second measuring circuit 405 contains a second pair of replica transistors 535, 537, a second current subtracting circuit 511, and a second fixed differential biasing circuit 513.

The exemplary electronic circuit 102 is an RF amplifier containing one transistor 539 with its source grounded. An input matching network 521 receives an input signal, and outputs to an input bias "T" 523, which drives the gate of the transistor 539. The drain of the transistor 539 is connected to an output bias "T" 525, which in turn outputs to an output matching network 527.

Figure 6:
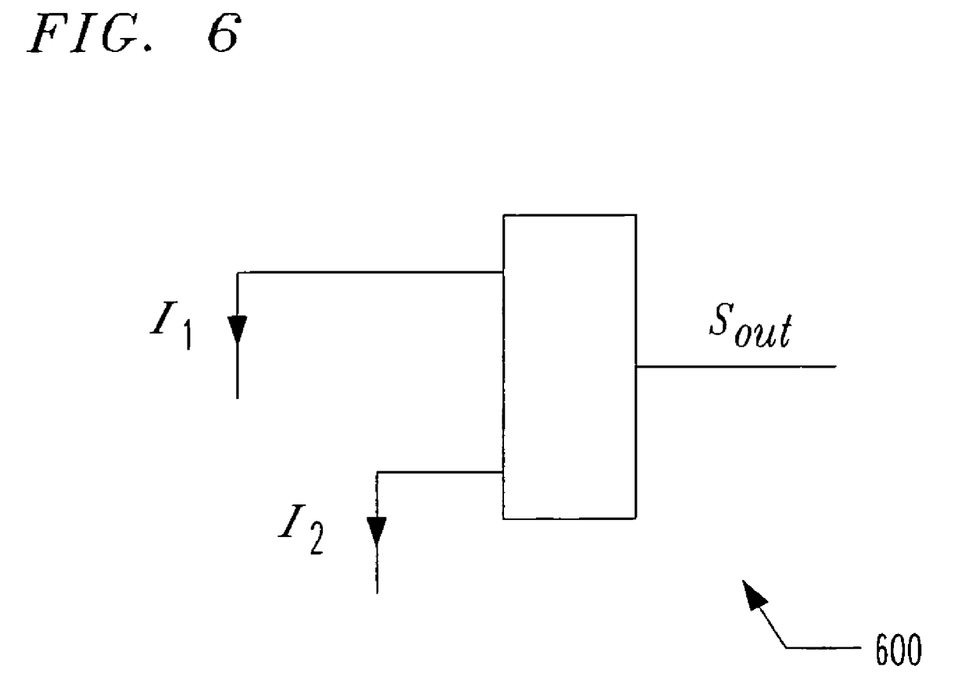
FIG. 6 depicts current-subtracting circuits of the first and second measuring circuit shown in FIGS. 4 and 5.

FIG. 6 depicts current-subtracting circuits of the first and second measuring circuit 404, 405 shown in FIGS. 4 and 5.

In particular, as shown in FIG. 6, a current-subtracting circuit 600 produces an output signal (e.g., current, voltage and/or other physical quantity) that is proportional to the difference of the two input currents.

$$S_{OUT} = \gamma(I_1 - I_2)$$

The output signal may also contain a well-defined constant.

Figure 6A:
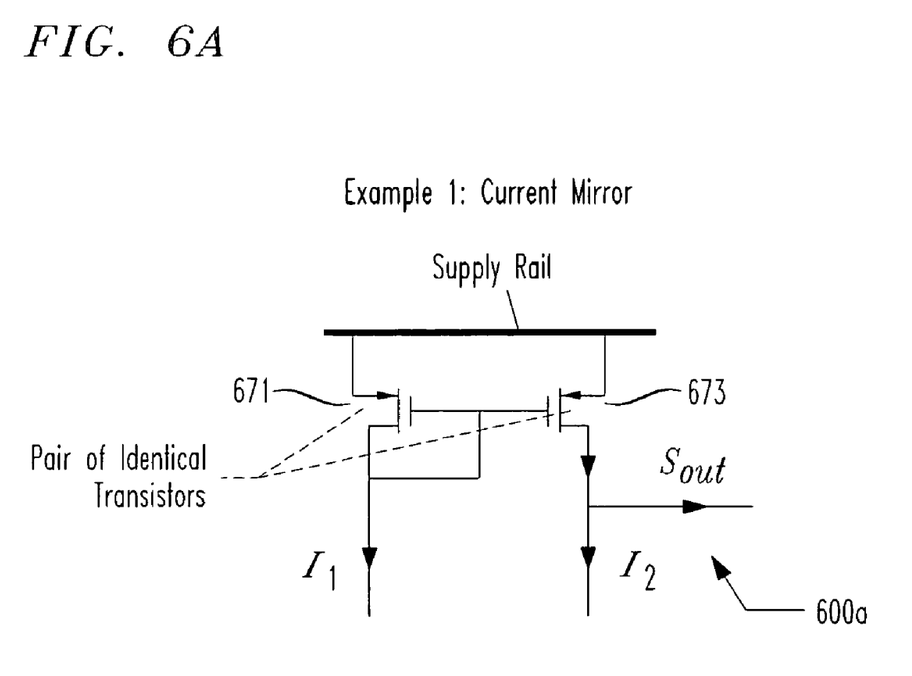
FIG. 6A shows an exemplary current mirror circuit forming the current-subtracting circuit shown in FIG. 6.

FIG. 6A shows an exemplary current mirror circuit 600*a* forming the current-subtracting circuit shown in FIG. 6.

In particular, as shown in FIG. 6A, a current mirror circuit 600*a* includes a pair of identical transistors 671, 673. The output current signal $S_{OUT}$ may be represented as:

$$S_{OUT}=I_1-I_2$$

Figure 6B:
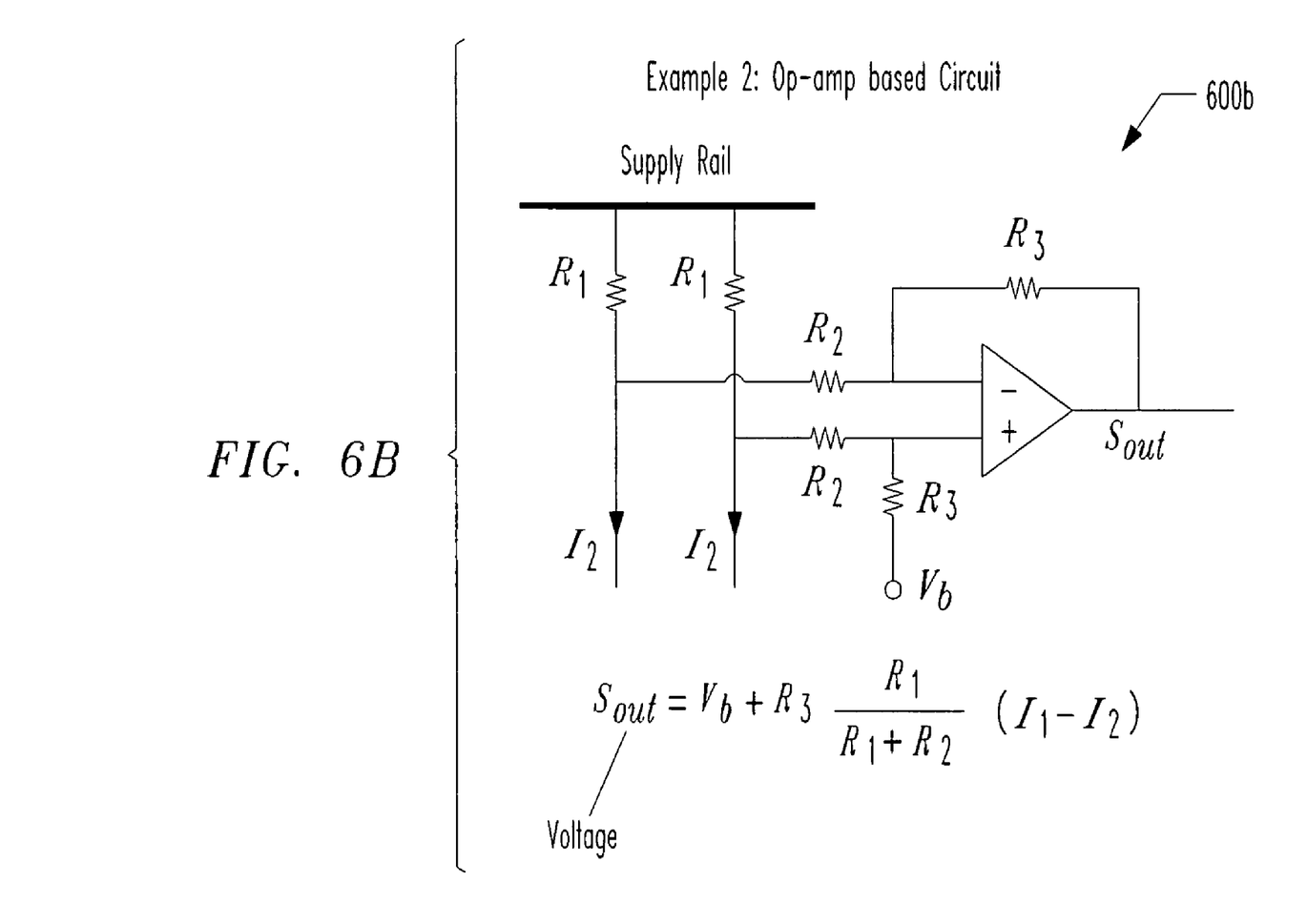
FIG. 6B shows an exemplary op-amp based circuit forming the current-subtracting circuit shown in FIG. 6.

FIG. 6B shows an exemplary op-amp based circuit 600*b* forming the current-subtracting circuit 600 shown in FIG. 6.

The output voltage signal $S_{OUT}$ may be represented as:

$$S_{OUT} = V_b + R_3 \frac{R_1}{R_1 + R_2}(I_1 - I_2)$$

FIGS. 6A and 6B show exemplary implementations of a current-subtracting circuit 600. Many other possible implementations exist, and are within the scope of the present invention.

Figure 7:
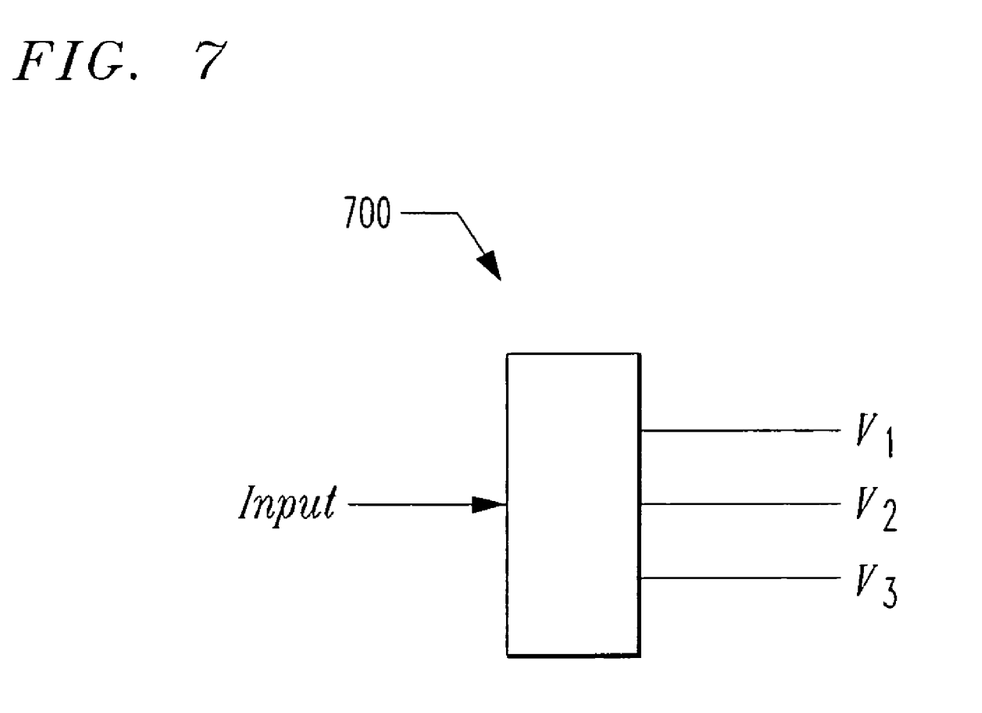
FIG. 7 depicts controlled differential biasing circuits of the first and second measuring circuit shown in FIGS. 4 and 5.

FIG. 7 depicts a controlled differential biasing circuit 700 of the first and second measuring circuit 404, 405 shown in FIGS. 4 and 5.

As shown in FIG. 7, the controlled differential biasing circuit 700 has one input terminal, and three output voltage terminals. The output voltages relate as follows:

$$V_1=V+\Delta$$
$$V_2=V$$
$$V_3=V-\Delta$$

Thus, the first voltage $V_1$ is larger than the second $V_2$. The second voltage $V_2$ is larger than the third $V_3$. The difference between the first voltage $V_1$ and the second voltage $V_2$ equals the difference between the second voltage $V_2$ and the third voltage $V_3$. The input terminal controls the value of the second output voltage $V_2$ without affecting the difference.

Figure 7A:
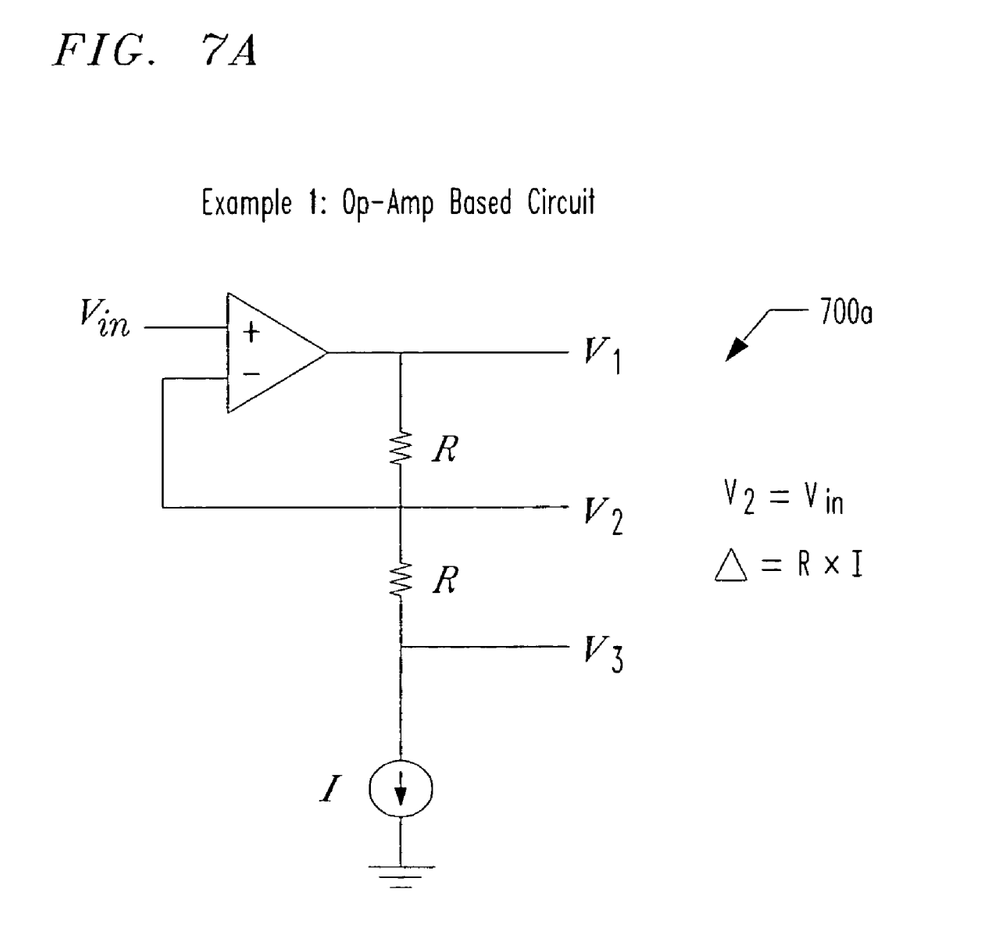
FIG. 7A shows an exemplary op-amp based differential biasing circuit shown in FIG. 7.

FIG. 7A shows an exemplary op-amp based differential biasing circuit 700*a*, wherein $V_2=V_{in}$; and delta=R×I. Note the current source shown in FIG. 7A is typically implemented using a suitable transistor.

Figure 7B:
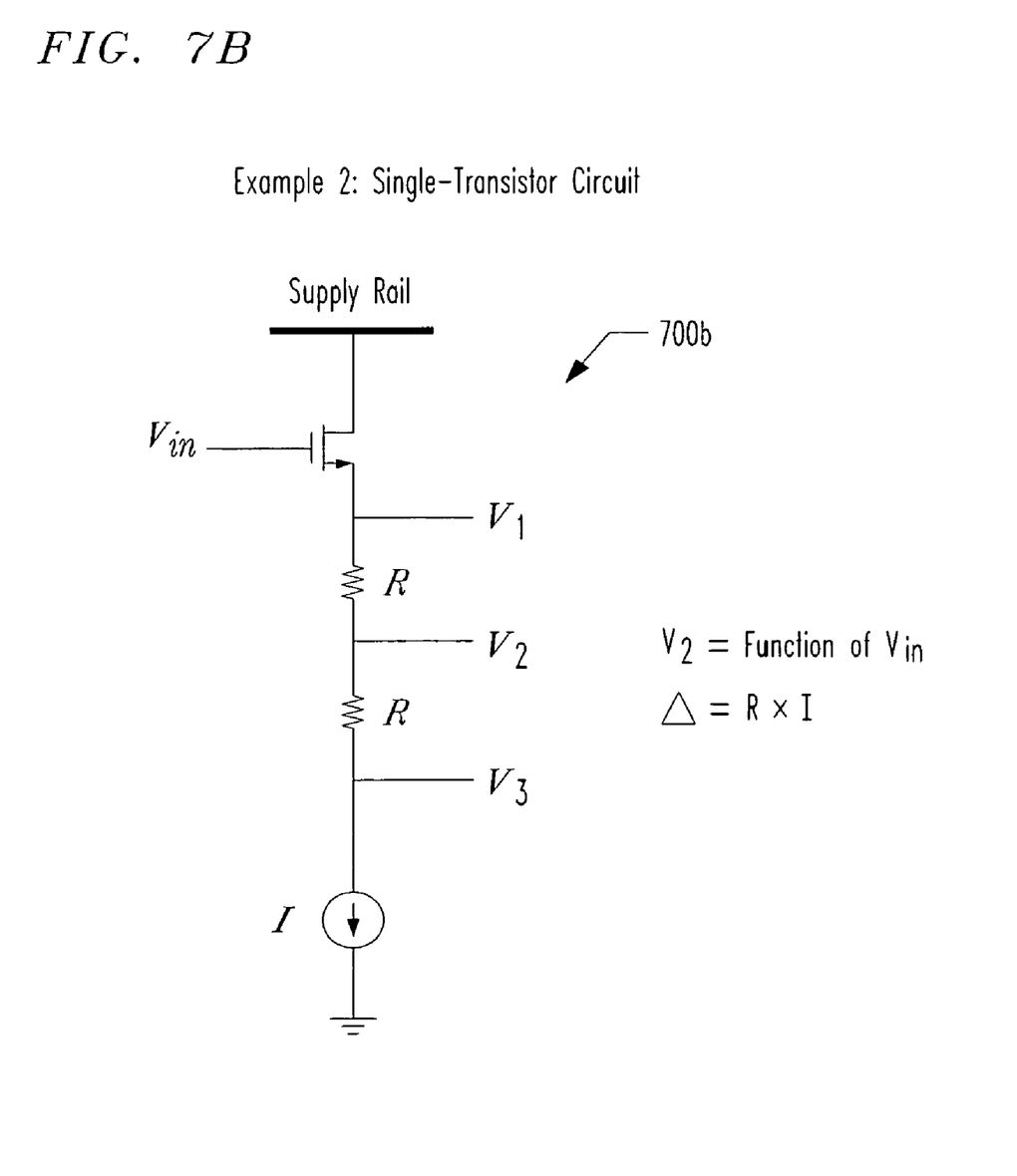
FIG. 7B shows an exemplary single-transistor based differential biasing circuit shown in FIG. 7.

FIG. 7B shows an exemplary single-transistor based differential biasing circuit 700*b*, wherein $V_2$ is a function of $V_{in}$, and delta=R×I.

FIGS. 7A and 7B show exemplary implementations of a controlled differential biasing circuit 509, 513. Many other possible implementations exist, and are within the scope of the present invention.

Figure 8:
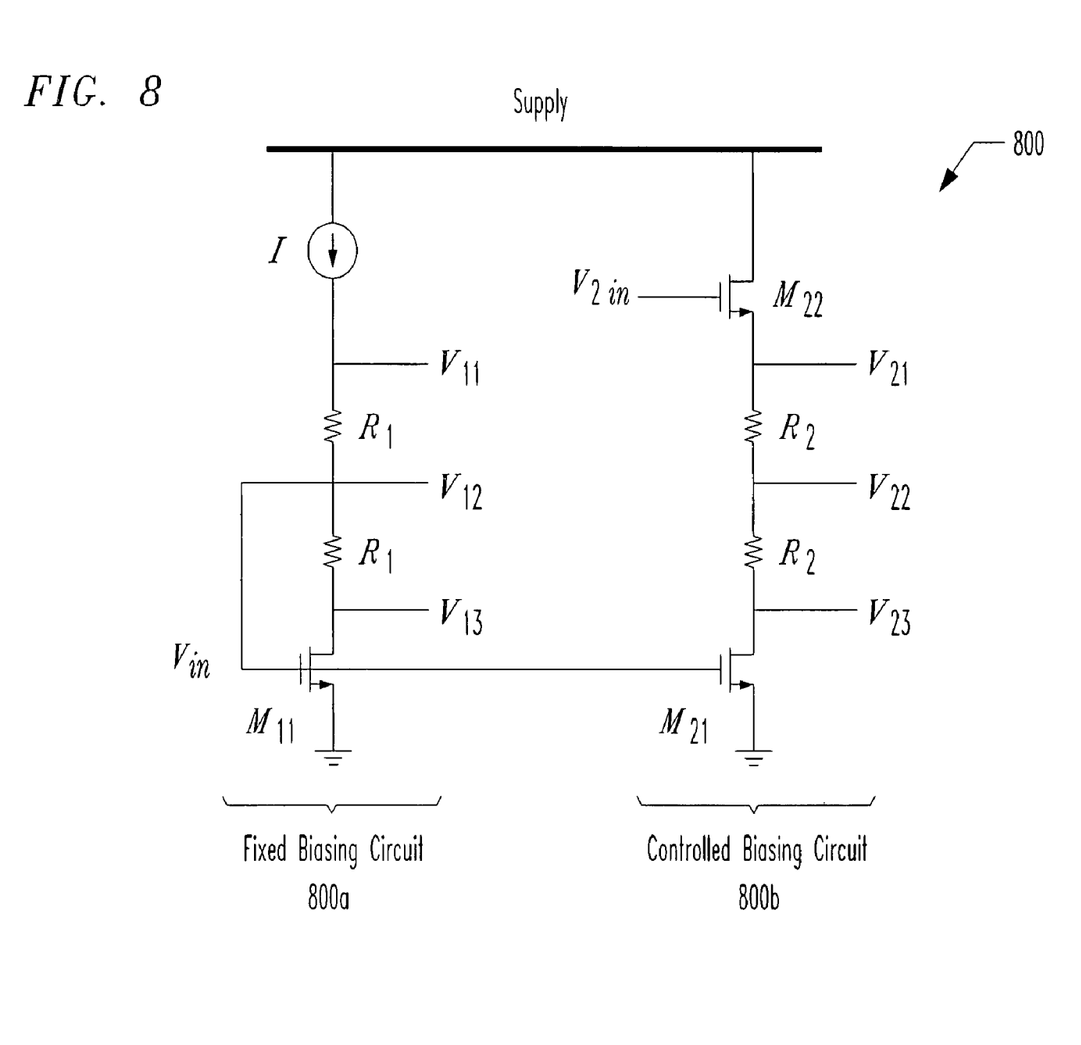
FIG. 8 shows an exemplary differential combo (fixed-controlled) biasing circuit of the first and second measuring circuit shown in FIGS. 4 and 5.

FIG. 8 shows an exemplary differential combo (fixed-controlled) biasing circuit of the first and second measuring circuit shown in FIGS. 4 and 5. The differential combo (fixed-controlled) biasing circuit 800 includes a fixed biasing circuit 800*a* and a controlled biasing circuit 800*b*.

Thus, a method and apparatus are provided for biasing of a power device, module or amplifier, particularly those operating in Class-AB. The disclosed embodiments minimize crossover distortion over a broad range of operating conditions, not only for a nominal case.

In accordance with the principles of the present invention, the bias current of a power transistor is automatically adjusted in response to process and temperature variations. Preferably, the adjustment is performed using an error-feedback arrangement.

An exemplary 'rule' for bias adjustment involves satisfying a proportionality relationship between the small-signal device transconductance at the operating point, and a maximum device transconductance. The disclosed adaptive bias scheme utilizes a dual replica master-slave control architecture.

The present invention provides a self-adapting circuit that changes the bias current (or voltage) so that the value is always the optimum value, irrespective of operating temperature and/or process variations. Also, a method is disclosed that uses an automatic bias that minimizes crossover distortion. For example, as the device heats up, the bias current changes so that a minimum amount of crossover distortion is generated.

Crossover distortion arises from odd-order device non-linearity. Even-order non-linearity is found to not cause problems at radio frequencies (RF). Crossover distortion is most pronounced for moderate signal levels. At high signal levels, compressive-type distortion dominates. Crossover distortion has the highest sensitivity to changes in the gate/base bias, and can be observed in a power-gain vs. output-power amplifier plot as a deviation from flatness for small to moderate signal levels.

The term crossover distortion is mostly used with push-pull (2-transistor) power amplifiers but it is also a valid description of a signal-transistor Class-AB amplifier. We disclose the use of an automatic bias that maximizes the 'flatness' of the amplifier's $G_P$ vs. $P_{out}$ characteristic for small to moderate signals.

The gain for small input signals is proportional to the transconductance of the device at the operating point $gm_{o.p.}$, while that for moderately large signals can be shown to be proportional to ½ of the maximum device transconductance $gm_{max}$. Therefore, satisfying the condition:

$$gm_{o.p.} \approx \tfrac{1}{2} gm_{max}$$

should yield the maximum flatness.

The term 'transconductance' is referred to herein as representing the slope of the transistor V-I characteristic at a given operating point (bias).

More specifically, an automatic gate/base bias is disclosed that forces a proportionality relationship between the transconductance for this specific automatic gate/base bias and the maximum device transconductance. In the preferred embodiment, this proportionality is ideally approximately ½. However, the principles of the invention relate to all proportionalities, not just the desired proportionality of ½.

This implies that while the power device is in use, one should be able to measure its peak transconductance as well as the transconductance at the operating point. However, since this particular measurement is unfeasible, a master-slave bias approach is implemented. Thus, the automatic gate/base bias preferably forces a proportionality relationship between the transconductance for this specific bias and the maximum device transconductance using a master-slave arrangement.

Using such a master-slave arrangement, a control loop is closed around a replica device (the master). The developed gate bias is then applied to the 'real' device (the slave) in an open-loop fashion. Thus, since no measurements have to be taken upon the main device, the same can be used while the bias adaptation takes place.

Understandably, for proper operation of the master-slave technique, good matching between the real and replica devices is required. In practice, to conserve power and/or chip area, the replica device may preferably be a scaled-down version of the original or real device.

The disclosed automatic gate/base bias forces a proportionality relationship between the transconductance for this specific bias and the maximum device transconductance using a master-slave arrangement wherein at least two replica devices are implemented.

In particular, in conventional master-slave topologies, a parameter such as the transconductance of a device is set to a predetermined constant value. This is accomplished using one replica device. In accordance with this aspect of the present invention, a relationship is forced between two transconductance values, neither of which is well defined or constant. Thus, at least two replica devices are desired.

For proper operation, the automatic adjustable bias generator circuit requires good device-to-device matching and scalability. That is, if a device with dimensions W and L has certain transconductance, than a device built with N such devices connected in parallel for the same bias voltage must have n-times larger transconductance.

Note that the particularly disclosed circuit is not the only topology that may be used to implement the inventive method. In particular, other seemingly different topologies are possible without deviating significantly from the spirit of the operation of the above-described invention.

While the embodiments of the present invention have been shown and described biasing a single transistor, the principles of the invention relate equally to biasing a push-pull arrangement with more than one transistor.

The present invention introduces self-biasing of a power device, module or amplifier wherein no external bias or manual adjustment is necessary, thereby saving production or lab time. Moreover, it improves amplifier robustness to process and temperature variations, thereby increasing yield. Additionally, exceptional flatness for small to moderate signals are produced in power devices with respect to a gain vs. power plot for different case temperatures. The disclosed master-slave bias arrangement requires only a small number of transistors with the use of complementary p-channel or pnp devices to provide a high-gain error-feedback arrangement.

While the invention has been described with reference to the exemplary embodiments thereof, those skilled in the art will be able to make various modifications to the described embodiments of the invention without departing from the true spirit and scope of the invention.

What is claimed is:

1. A system for biasing an electronic circuit containing a non-linear device, comprising:
    an electronic circuit containing a non-linear device, said electronic circuit being operative to produce an output analog signal from an input analog signal;
    a sensing circuit coupled to said electronic circuit, said sensing circuit being operative to produce a first signal proportional to a first transconductance value of said non-linear device, and a second signal proportional to a second transconductance value of said non-linear device;
    a comparator circuit coupled to said sensing circuit, said comparator circuit being operative to produce an error signal based on said first signal and said second signal;
    a control circuit coupled to said comparator circuit, said control circuit being operative to adjust said second transconductance value of said non-linear device using said error signal to provide a feed-back signal to said electronic circuit.

2. The system for biasing an electronic circuit containing a non-linear device according to claim 1, wherein said electronic circuit further comprises:
    a control terminal that influences transconductance value of said non-linear device.

3. The system for biasing an electronic circuit containing a non-linear device according to claim 1, wherein:
    said first signal and said second signal correspond to a first set point of said control terminal and a second set point of said control terminal, respectively; and
    said first set point is different from said second set point.

4. The system for biasing an electronic circuit containing a non-linear device according to claim 1, wherein:
    said feed-back signal operates upon said control terminal to maintain a constant ratio between said first signal and said second signal.

5. The system for biasing an electronic circuit containing a non-linear device according to claim 1, wherein:
    said feed-back signal operates upon said control terminal to maintain a constant ratio between a transconductance of said non-linear device for said first set point, and a transconductance of said non-linear device for said second set point.

6. The system for biasing an electronic circuit containing a non-linear device according to claim 1, wherein said comparator circuit comprises:
    a linear circuit coupled to said sensing circuit, said linear circuit being operative to produce a signal based on a linear combination of said first signal and said second signal; and
    a zero-forcing amplifier coupled to an output of said linear circuit and a ground node, said zero-forcing amplifier being operative to amplify a difference between the two input signals and under close-loop system operation force this difference to zero.

7. The system for biasing an electronic circuit containing a non-linear device according to claim 1, wherein said sensing circuit comprises:
    at least one replica of said non-linear device.

8. The system for biasing an electronic circuit containing a non-linear device according to claim 7, wherein:
    said at least one replica of said non-linear device is fabricated in a same technology process as said non-linear device.

9. The system for biasing an electronic circuit containing a non-linear device according to claim 7, wherein:
    said at least one replica of said non-linear device is placed in close thermal contact with said non-linear device.

10. The system for biasing an electronic circuit containing a non-linear device according to claim 7, wherein:
    said at least one replica of said non-linear device is a scaled-down version of said non-linear device.

11. The system for biasing an electronic circuit containing a non-linear device according to claim 7, wherein:
    a ratio between said first transconductance and said second transconductance of each of said at least one replica of said non-linear device is substantially the same as a ratio between said first transconductance and said second transconductance of said non-linear device.

12. The system for biasing an electronic circuit containing a non-linear device according to claim 1, wherein:
    said first signal and said second signal are proportional to said first transconductance and said second transconductance of said at least one replica of said non-linear device.

13. The system for biasing an electronic circuit containing a non-linear device according to claim 1, wherein said sensing circuit comprises:
    a first replica-measuring block comprising at least one replica device, a first output terminal, and a first control terminal; and a second replica-measuring block comprising at least one replica device, a second output terminal, and a second control terminal;

wherein said first replica-measuring block is operative to produce a first signal proportional to said first transconductance of said comprised at least one replica device, said first transconductance being established by applying appropriate constant signal on said first control terminal; and said second replica-measuring block is operative to produce a second signal proportional to said second transconductance of a comprised at least one replica device.

14. A method of automatically biasing a power device, comprising:

providing a first replica device that is a scaled-down version of said power device;

forcing a proportionality relationship between a transconductance for a bias output to said first replica device and a maximum transconductance of said power device; and automatically adjusting a bias output to said power device based on changes in said bias output to said first replica device.

15. The method of automatically biasing a power device according to claim 14, wherein:

said proportionality relationship is approximately ½.

16. The method of automatically biasing a power device according to claim 14, further comprising:

maximizing a flatness of a $G_P$ vs. $P_{out}$ characteristic of said power device for small to moderate signals.

17. The method of automatically biasing a power device according to claim 14, wherein:

said power device is a power transistor.

18. The method of automatically biasing a power device according to claim 14, wherein:

said power device is a power amplifier.

19. The method of automatically biasing a power device according to claim 14, further comprising:

providing a second replica device that is a scaled-down version of said power device.

20. The method of automatically biasing a power device according to claim 19, further comprising:

providing a fixed bias to said second replica device.

21. The method of automatically biasing a power device according to claim 14, wherein:

said automatically adjusting step automatically adjusts a gate/base bias current using an error-feedback arrangement.

* * * * *